United States Patent [19]

Sueoka et al.

[11] 4,291,325

[45] Sep. 22, 1981

[54] DUAL GATE CONTROLLED THYRISTOR WITH HIGHLY DOPED CATHODE BASE GRID COVERED WITH HIGH RESISTIVITY BASE LAYER

[75] Inventors: Tetsuro Sueoka, Numazu; Satoshi Ishibashi, Higashimine, both of Japan

[73] Assignee: Kabushiki Kaisha Meidensha, Japan

[21] Appl. No.: 109,677

[22] Filed: Jan. 4, 1980

[30] Foreign Application Priority Data

Jan. 29, 1979 [JP] Japan .................................. 54-9566

[51] Int. Cl.³ .......................................... H01L 29/74
[52] U.S. Cl. ...................................... 357/38; 357/20; 357/55; 357/86
[58] Field of Search ....................... 357/38, 86, 55, 20

[56] References Cited

U.S. PATENT DOCUMENTS

| | | |
|---|---|---|
| 3,906,545 | 9/1975 | Schlanggnotto et al. ............ 357/38 |
| 4,092,703 | 5/1978 | Sueoka et al. ....................... 357/38 |

FOREIGN PATENT DOCUMENTS

| | | | |
|---|---|---|---|
| 1803935 | 10/1969 | Fed. Rep. of Germany ........ 357/38 |
| 2299727 | 8/1976 | France ................................. 357/38 |
| 54-757 | 1/1979 | Japan .................................. 357/38 |

*Primary Examiner*—Joseph E. Clawson, Jr.
*Attorney, Agent, or Firm*—McGlew and Tuttle

[57] ABSTRACT

A gate controlled semiconductor device comprises two main electrode members provided on a wafer having at least one junction formed between two alternately different conductivity typed semiconductive layers and a control electrode member in which the same or a different conductivity typed surface is provided on one layer of the wafer. The control electrode member is provided on the wafer adjacent one of the main electrodes. The control electrode member includes a low resistance layer embedded in one surface of the wafer and consists of a wide bridging portion, a plurality of relatively wide main trunk portions projecting from the bridging portion and a plurality of narrow branch portions branching from the main trunk portions.

6 Claims, 4 Drawing Figures

DUAL GATE CONTROLLED THYRISTOR WITH HIGHLY DOPED CATHODE BASE GRID COVERED WITH HIGH RESISTIVITY BASE LAYER

BACKGROUND OF THE INVENTION

The present invention relates to a gate controlled semiconductor device and, more particularly to an improvement of the construction of a control electrode member of the gate controlled semiconductor device.

A gate controlled semiconductor device having a control electrode member is, generally, employed to switch on only and/or to switch on and off a current which flows in the gate controlled semiconductor device by supplying an ON signal and/or ON and OFF signals to the gate electrode member. There are various switching devices such as, for example, a gate turn-off thyristor, a power transistor, a field effect transistor, a usual transistor, an auxiliary gate turn-off thyristor, a reversely conducting thyristor, a high frequency thyristor and the like, as the gate controlled semiconductor device having the control gate electrode.

In this gate controlled semiconductor device, an important problem is how to supply a control current effectively between a main electrode portion and a control electrode portion of the device by rendering a resistance value between the main electrode portion and the control electrode portion, small, in the case of making a main current which flows in between a plurality of main electrode portions turn on and/or turn on and off.

FIGS. 1 and 2 show a prior art gate controlled semiconductor device in the form of a gate turn-off thyristor. In this case, it should be noted that the dimensions of the figures are exaggerated for clarity.

In FIGS. 1 and 2, reference character 1 shows a disc-shaped wafer which comprises a $P_1$ layer 2, an $N_1$ layer 3, a $P_2$ layer 4 and an $N_2$ layer 5. A metallic layer 6 is arranged on an exposed surface of the $N_2$ layer 5 to form a cathode electrode assembly K. A metallic layer 7a is arranged on the center portion of the $P_2$ layer 4 to form a first gate electrode assembly $G_1$, and a metallic layer 7b is arranged on an exposed surface of a low resistance $P_2^+$ layer 9 which is provided in the $P_2$ layer 4 in order to form a second gate electrode assembly $G_2$.

In more detail, an annular slot 11 is provided at the edge portion of a surface of the $P_2$ layer 4, and an annular $P_2^+$ layer 9 is provided in the bottom portion of which resistance value is relatively low. A plurarity of $P_2^+$ layers 9a, 9b, 9c and 9d are coaxially embedded in the $P_2$ layer 4, and a plurarity of $P_2^+$ layers 9l are radially embedded in the $P_2$ layer 4 so as to connect the $P_2^+$ layers 9a to 9d. A low resistance embedded layer 10 is comprised by the $P_2^+$ layers 9, 9a to 9d and 9l to 9e which are embedded in the $P_2$ layer 4 so as to oppose the $N_2$ layer 5. An anode electrode assembly A is formed by arranging a metallic layer 8 on the surface of the $P_1$ layer 2.

In the above constructed gate turn-off thyristor of the prior art, it is desirable that the resistance value of the embedded resistor layer 10 is low as can be possible. In the case of manufacturing such a low resistance layer by means of the diffusion method, it is, however, impossible to decrease the specific resistance of the low resistance layer, because the surface density thereof is about $5 \times 10^{20}$ when the low resistance layer is manufactured by diffusing boron. Particularly, in a large current capacity gate turn-off thyristor with a junction diameter on the order of about 40 millimeter, the dimension of the length of the low resistance buried layer 10 is large and a current to be supplied to the buried layer 10 is great. The structure of the buried layer has, however, various advantages such as the fact that the surface shape of the $N_2$ layer 5 does not become complicated, the withstand voltage between a gate electrode assembly and a cathode electrode assembly can be made high and the effective area of the cathode electrode which enables the flow of a load current with respect to the whole area of an element is favorable. An opposing area of the buried layer 10 to the $N_2$ layers 5 must be large in order to decrease the resistance value of the gating current path. When the opposing area of the buried layer 10 is large, a region in which the load current can flow becomes narrow, since the load current can not flow through the low resistance buried layer 10. Accordingly, a using rate of the area in the gate turn-off thyristor is decreased.

SUMMARY OF THE INVENTION

Accordingly, an object of the invention is to provide a high performance gate controlled semiconductor device which has a low resistance layer as a control electrode and which is applicable to control a large magnitude current, without decreasing a resistance value of the low resistance layer.

With the foregoing in mind, the present invention resides in that a gate controlled semiconductor device comprises at least two main electrode members which are provided on a wafer having at least one junction formed between two alternately different conductivity typed semiconductive layers and a control electrode member in which the same or different conductivity typed layers provided on one layer of the wafer, wherein the control electrode member is provided on the wafer adjacent one main electrode of the main electrode member, and the low resistance layer comprises a plurality of trunk portions projecting from a bridging portion and plurarity of branch portions branching from the main trunk portions.

BRIEF DESCRIPTION OF THE DRAWINGS

The invention will now be described more fully with reference to the drawing in which.

DETAILED DESCRIPTION OF THE PREFERRED EMBODIMENT

Figure 1:
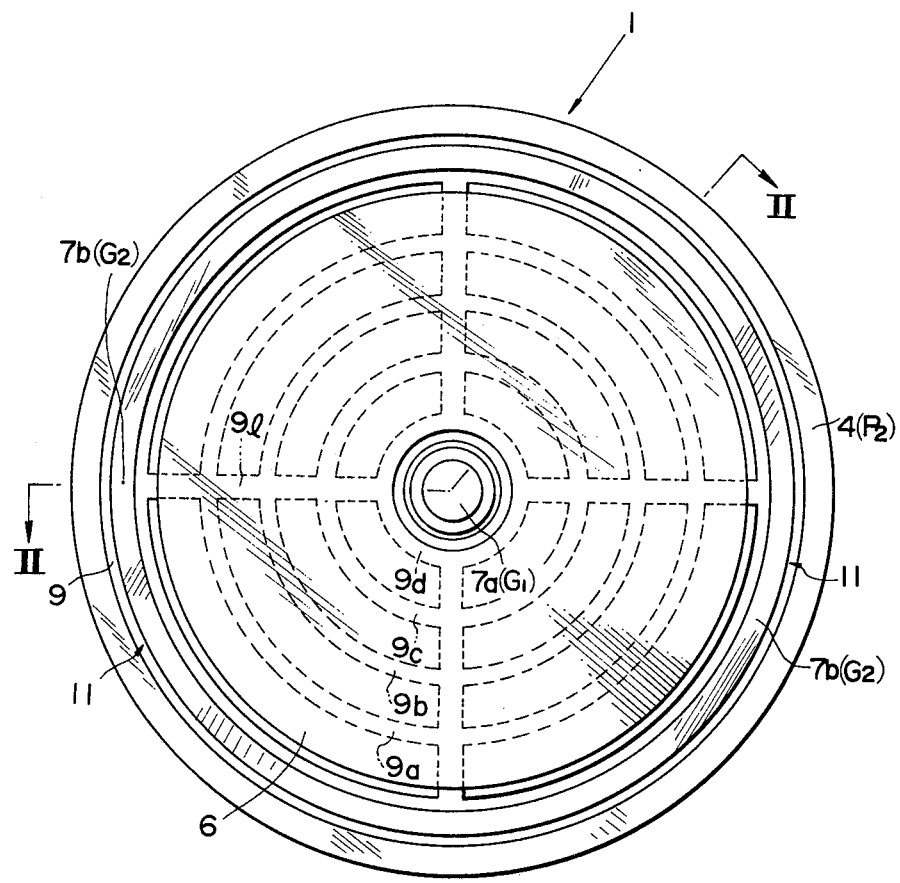
FIG. 1 is a plan view of a typical prior art gate controlled semiconductor device in the form of a gate turn-off thyristor.
Figure 2:
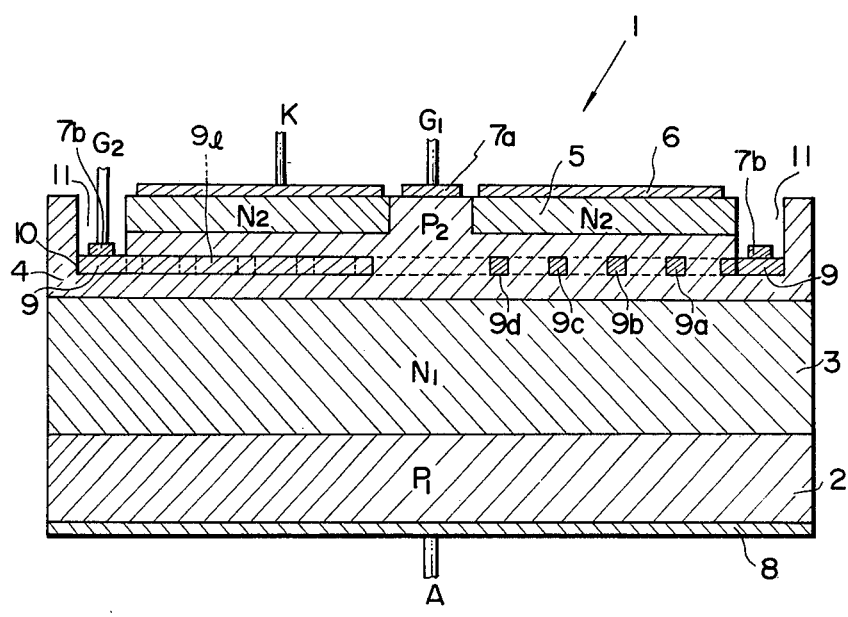
FIG. 2 is a sectional view taken along a line II—II of FIG. 1.
Figure 3:
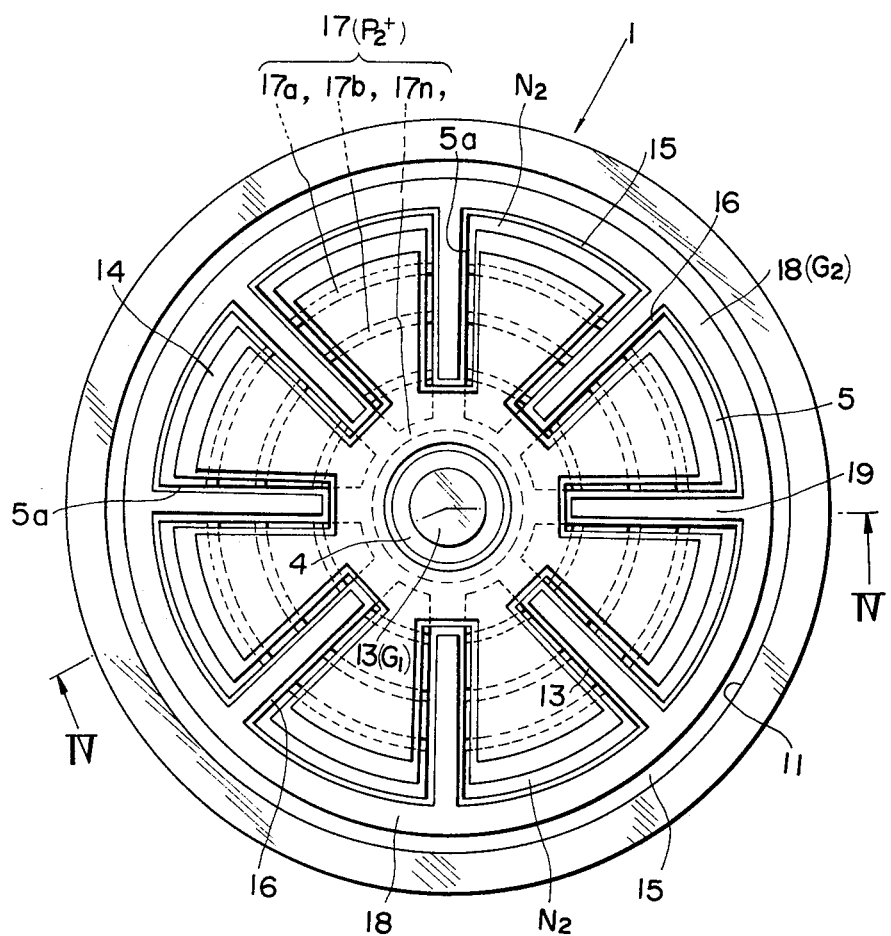
FIG. 3 is a plan view of a gate controlled semiconductor device in accordance with the present invention.
Figure 4:
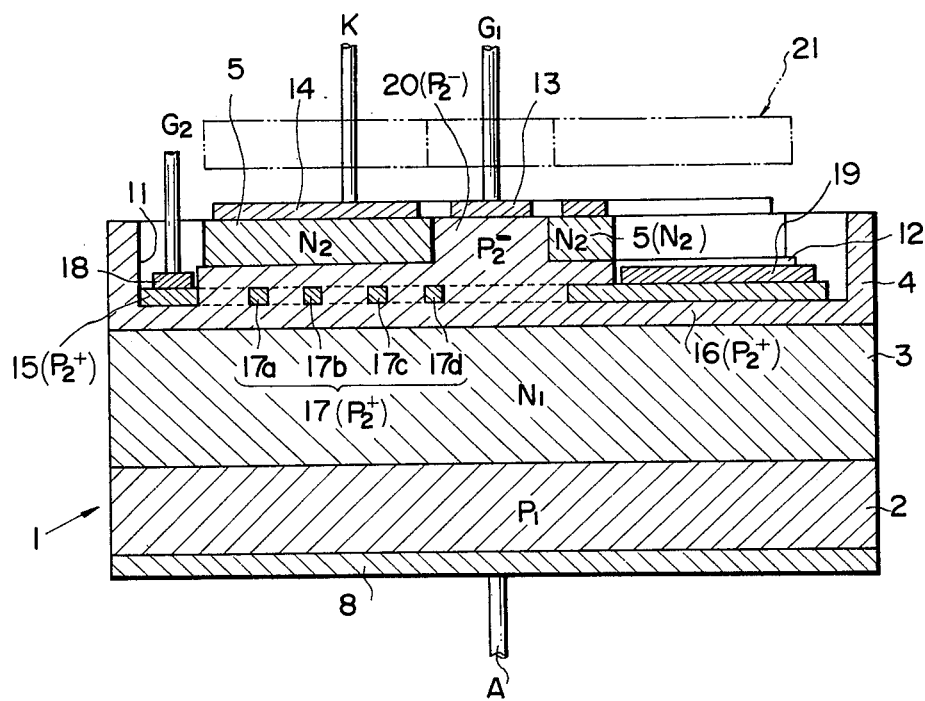
FIG. 4 is a sectional view taken along a line IV—IV of FIG. 3.

With reference now to FIGS. 3 and 4 of the drawing, there is shown a gate controlled semiconductor device in the form of a gate turn-off thyristor in accordance with the present invention. As is best shown in FIGS. 3 and 4, a disc-shaped wafer 1 of the semiconductive material is constructed of a $P_1$ or first layer 2, an $N_1$ or second layer 3, a $P_2$ layer 4 or third and an $N_2$ or fourth layer 5. A metallic layer 13 is arranged on a center portion of an exposed surface of the $P_2$ layer 4 to form a first gate electrode assembly $G_1$ which constitutes a control electrode member. The disc-shaped $N_2$ layer 5 is provided on the exposed surface of the $P_2$ layer 4 to a given depth. An annular slot 11 is provided on the periphery of the exposed surface of the $P_2$ layer 4 so as to be located to the outer side of the $N_2$ layer 5 in the $P_2$ layer 4. A plurarity of slots 12 are radially provided at a given depth in the $P_2$ layer 4 so as to extend toward the center portion of the $P_2$ layer and so as to communicate with the annular slot 11. Accordingly, a plurarity of radial slits 5a are formed in an outer portion of the $N_2$ layer 5. A metallic layer 14 having the similar shape to the $N_2$ layer 5 is arranged on a surface of the $N_2$ layer 5, and thereby a cathode electrode assembly is formed.

As is best shown in FIG. 4, a high desity impurity layer in the form of an annular $P_2^+$ layer 15 having a low resistance value is provided on the bottom of the annular groove 11 to form a first low resistance layer. A plurality of high density impurity layers such as $P_2^+$ layers 16 which has a low resistance value, are provided in the grooves 12 so as to extend toward the center portion of the $P_2$ layer 4 from the annular $P_2^+$ layer 15, and thereby a second low resistance layer is formed. A low resistance buried layer 17 consists of a plurarity of high density impurity layers in the form of annular $P_2^+$ layers 17a, 17b, 17c and 17d having low resistance values are embedded in the $P_2$ layer 4 so that the adjacent second low resistance layers are short-circuited. Specifically, the low resistance buried layer 17 forms a branch portion which branches from the second low resistance layers. An annular metallic layer 18 is arranged on the annular $P_2^+$ layer, and a plurality of metallic layer 19 are also arranged on the $P_2^+$ layers 16. Accordingly, a second gate electrode assembly $G_2$ comprises the metallic layer 18 arranged on the $P_2^+$ layer 15 and the plurarity of metallic layers 19 which are arranged on the $P_2^+$ layer 16.

A device of the kind described above was made essentially as follows.

First, a weakly N-type wafer 1 was prepared. A $P_1$ layer 2 and a $P_2$ layer 4 of a P-type layer were manufactured by the thermal diffusion of material which is in third group in the periodic table such as, for example, germanium into an N-type silicon. Next, oxide films were placed over surfaces of the $P_1$ layer 2 and $P_2$ layer 4, and thereafter the oxide film arranged on the surface of the $P_2$ layer 4 was partially removed in conformity with the pattern of the low resistance layers. A P-type impurity in the form of boron was selectively diffused at the high density into the surface of the $P_2$ layer 4 from which the oxide film was removed. As is best shown in FIG. 3, the annular and relatively wide $P_2^+$ layer 15 is provided on the peripheral portion of the surface of the $P_2$ layer 4. The relatively wide $P_2^+$ layers 16 are provided in the $P_2$ layers 4 so that these extend toward the center portion of the $P_2$ layer 4 from the $P_2^+$ layer 15. Moreover, the relatively narrow $P_2^+$ layers 17a, 17b, 17c and 17d are provided in the $P_2$ layer 4 so as to connect the $P_2^+$ layers 16. After diffusing the boron into the $P_2$ layer 4 in accordance with the pattern of the $P_2^+$ layers 17a to 17d, a P-type silicon monocrystal and low density impurity layer in the form of a $P_2^-$ layer 20 is formed to a given thickness by providing the epitaxial growth over the whole surface of the $P_2$ layer 4. In this case, the epitaxial growth layer is a relatively high resistance $P_2^-$ layer of which resistance value is of the order of 10 to 20 ($\Omega$-cm).

Further, the $N_2$ layers 5 was formed by diffusion of an N-type impurity material which is a fourth group element such as, for example, phosphrus, on a surface of the $P_2^-$ layer 20 by the same manner as described above. Moreover, the resistance value of the wide portions of the low resistance $P_2^+$ layers 15 and 16 which were buried in the $P_2$ layer 4 were decreased further, and thereafter the $P_2^-$ layers overlapping the wide portions was removed by the selective etching method in order to provide an electrode wire on the $P_2^+$ layer 15. The selective etching was performed by the method of steps that an etching protective film has coated on the surface of wafer 1, excepting the pattern of the second gate electrode assembly $G_2$, and thereafter the portions on which the protective film has not coated were engraved by etching by means of a mixed liquid consisting of the nitric acid and hydrofuoric acid so that the $P_2^+$ layers were exposed, in order to form the ring-shaped slot 11 and the slots 12 projecting toward the center portion of the $P_2$ layer 4.

Next, aluminum layers were adhered to each surface of the $P_2^+$ layers 15 and 16, the $P_2^-$ layer 20 which constitutes the first gate electrode assembly $G_1$, and the cathode $N_2$ layers, as electrodes to be ohmically connected. As an adhessing method of the aluminum, the aluminum is usually evaporated to the whole surface of these portions, and thereafter unnecessary portions are removed by means of etching and thence the wafer is sintered at a temperature ranging from 400° C. to 500° C. in order to ensure the adhession thereof.

In addition, a metallic layer 8 was adhered to the surface of the $P_1$ layer 2 to form the anode electrode assembly A. A metallic layer 14 was arranged on the $N_2$ layer 5 to form the cathode electrode assembly K. A metallic layer 18 was arranged on the exposed surface of the $P_2^+$ layer 15 and a plurality of metallic layers 19 were provided on the surfaces of the $P_2^+$ layers 16 to form a second gate electrode assembly $G_2$. Further, a metallic layer 13 was arranged on an exposed surface of the $P_2^-$ layer 20 in order to constitute a first gate electrode assembly $G_1$.

A disc-shaped external electrode 21 having a hole at its center was mounted on an aluminum electrode that was the metallic layer 14 which was arranged on the $N_2$ layer 5 in order to flow the great current by means of welding or compression. The slots 12 were provided on the surface of the $P_2$ layer 4 in order to electrically insulate the external electrode 21 and the metallic layers 19 of the $P_2^+$ layers 16. Additionally, another insulating material (not shown in the drawing) may be employed instead of the slots 12.

The gate turn-off thyristor constructed above is usually enclosed in an airtight sealed casing for protection. In this case, a four-terminal construction is formed by the anode electrode assembly A which is formed by the metallic layer 8, the cathode electrode assembly K which formed of the cathode layer $N_2$ and the metallic layer 14, the first age electrode assembly $G_1$ including the metallic layer 13 arranged on the surface of the $P_2^-$ layer 20 and the second gate electrode assembly $G_2$ having the ring-shaped $P_2^+$ layer 15 and the radial low resistance $P_2^+$ layer 16, the ring-shaped metallic layer 18 and the plurarity of metallic layers 19.

In operation, when a firing current is supplied from the first gate electrode assembly $G_1$ to the cathode electrode assembly K in the condition that a forward voltage is applied between the anode electrode assembly A and the cathode electrode assembly K, a thyristor portion which consists of the $P_1N_1P_2N_2$ layers is fired, and thereby the device is transferred from the non-conductive state to the conductive state to supply the current to an external load (not shown in the drawing).

The load current flowing through the device is interrupted by reversely biasing an $N_2P_2^-$ junction by means of supplying the current which as flowed into $G_1$, to the second gate electrode assembly $G_2$ from the cathode electrode assembly K, and thereby the gate turn-off thyristor is transfered to the non-conductive state. By reversing bias of the $N_2P_2^-$ junction, a high magnitude transient current is drawn from the second gate electrode assembly $G_2$. The drawn current from the second gate electrode assembly $G_2$ is represented by a usual so called turn-off gain according to the formula G=IATC/IGR. Where IATC is a load current to be turned off, and IGR is a reverse current to be supplied to the gate electrode.

The turn-off gain G is, in general, of the order of approximately 5 in a device in which a forward blocking voltage is of the order of 1,000 to 1,500 volts. Accordingly, it is necessary to supply a gate current of 200 ampeares in order to switch off the current of the order of 1,000 ampeares. In this case, the necessary diameter of the device is about 40 (mm).

A resistance value of the low resistance buried $P_2^+$ layer 17 is selected by the quantity of the diffused impurity, and a limited value of the quantity of the impurity is about $5 \times 10^{20}$ molecules/cm$^3$ when boron is used as the impurity. Both the width and the depth of the buried layer must be great.

On the other hand, when the depth of the buried layer is great, the width of the $P_2$ layer 4 located between the $N_2$ layer and the $N_1$ layer must be inevitably large. It is, however, not preferable to make the width of the $P_2$ layer 4 large, since the turn-off gain becomes small and further the conducting area becomes low as described above. According to the construction of the device in accordance with the present invention, the wide second low resistance layer of the low resistance layer 16 is provided in order to concentrate the current partially thereto, and moreover the metallic layers 19 in the form of the aluminum is adhered to the second low resistance layer 16. The resistance of this portion is almost negligible. It is, accordingly, appreciated that the problem is to consider the resistance value from the buried layer to the second low resistance layer. Namely, the device can be constructed without eliminating the effective cathode area even in the above described large silicon wafer.

In the conventional device, 30% is a ratio of an effective area of a cathode layer with respect to the area of the wafer which permits the flow of the load current and which has only a buried layer. On the other hand, the ratio of the cathode $N_2$ layer 5 with respect to the effective area of the wafer can be greatly increased to 45% according to the present invention.

In accordance with the above described embodiment, the following advantage are obtained. That is, a high performance gate controlled turn-off thyristor can be obtained, since the metallic layers 19 are arranged on the $P_2^+$ layers 16 which are the second low resistance layer of the low resistance layer. The decrement of the withstand voltage between the gate electrode and the cathode electrode can be prevented, since the slit portions and particularly the periphral portion of the $N_2$ layer 5 does not become large. Moreover, the compression strength of the external and thermal compensating electrode 21 against the surface of the cathode aluminum electrode 14 may be large and the thermal resistnce of the device becomes small, since the $N_2$ layer 5 is formed in the whole surface of an upper portion of the wafer 1.

Accordingly, in accordance with the present invention, the pattern of the low resistance buried layer is not limited to the device shown in FIGS. 3 and 4, modifications may be considered such as, for example, an involute, a radial pattern and the like. And further the invention is not limited to the above, the present invention is applicable to a usual thyristor, a power transistor, a field effect transistor and the like.

As is described in the foregoing, since the low resistance buried layer is formed in one layer of the wafer as well as the portion in which the metallic layer is arranged on the low resistance layer is employed as a control electrode of the device, the resistivity of the device may be decreased without eliminating the using rate of area of the device and, therefore, a high performance gate controlled semiconductor device which is useful for treating large magnitude current can be obtained.

In view of the above, it will be seen that the several objects of the invention are achieved and other advantageous results attained.

While a preferred embodiment of the invention have been shown and described, it will be apparent to those skilled in the art that modifications can be made without departing from the principle and spirit of the invention, the scope of which is defined in the appended claims. Accordingly, the foregoing embodiment is to be considered illustrative, rather than restricting of the invention and those modifications which come within the meaning and range of equivalency of the claims are to be included herein.

What is claimed is:

1. A gate controlled semiconductor device comprising:
   a semiconductor wafer made of: a first layer of one conductivity type; a second layer of an opposite conductivity type, connected to the first layer; a third layer of said one conductivity type connected to said second layer; said first and third layers having exposed surfaces; a high resistance layer of said one conductivity type formed on said third layer at said surface thereof to a selected depth; and a fourth layer of said second conductivity type connected into said high resistance layer having a surface;
   an anode electrode connected to said first layer exposed surface;
   a cathode electrode connected to said fourth layer surface;
   a first gate electrode layer connected to an exposed surface of said high resistance layer;
   said third layer having a first slot in the exposed surface thereof;
   a first low resistance layer at the bottom of said first slot;
   said third layer having a plurality of second slots extending into said fourth layer and communicating with said first slot;
   a second low resistance layer at the bottom of each of said plurality of second slots connected to said first low resistance layer;
   a second gate electrode layer for supplying an OFF signal to the device connected over a surface of said first and second low resistance layers; and at least one buried low resistance layer which is narrower than said first and second low resistance layers; embedded in said third layer and spaced from said second and fourth layers, connected to each of said second low resistance layers.

2. A device according to claim 1, wherein said first and second low resistance layers comprise high density impurity layers.

3. A device according to claim 2, wherein said high density impurity layers are formed of said one conductivity type.

4. A device according to claim 1, wherein said wafer is disc-shaped, said first layer comprising a P-type $P_1$ layer, said second layer comprising a N-type $N_1$, layer, said third layer comprising a P-type $P_2$ layer, said high resistance layer comprising a P-type $P_2^-$ layer formed in said $P_2$ layer, said fourth layer comprising an N-type $N_2$ layer formed in a disc-shape and having a hole in the center thereof through which a portion of said $P_2$ layer extends, said anode electrode comprising a metal layer adhered to an exposed surface of said $P_1$ layer, said cathode electrode comprising a metal layer adhered to an exposed surface of said $N_2$ layer, said first gate electrode layer comprising a metal layer adhered to an exposed surface of said high resistance $P_2^-$ layer and said second gate electrode layer comprising a metal layer adhered to said first and second low resistance layers, said first and second low resistance layers, comprising high density impurity layers.

5. A device according to claim 4, wherein said first slot comprises a ring-shaped slot formed adjacent an outer edge of said disc-shaped wafer, said first low resistance layer being ring-shaped and provided in said first slot, said plurality of second slots extending radially inwardly of said first slot, said second low resistance layers extending radially inwardly of said first low resistance layer, and additional buried low resistance layers, each of said additional and at least one buried low resistance layer comprising concentric ring-shaped layers disposed radially inwardly of said first slot each connected to said radially extending second low resistance layers.

6. A device according to claim 4, wherein said cathode electrode comprises a disc-shaped metal layer adhered to said $N_2$ layer and a disc-shaped metal plate contacting an exposed surface of said cathode electrode metal layer.

* * * * *